United States Patent [19]

Foster et al.

[11] Patent Number: 4,668,365

[45] Date of Patent: May 26, 1987

[54] APPARATUS AND METHOD FOR MAGNETRON-ENHANCED PLASMA-ASSISTED CHEMICAL VAPOR DEPOSITION

[75] Inventors: Robert Foster, San Francisco; David N. Wang, Cupertino; Sasson Somekh, Redwood City; Dan Maydan, Los Altos Hills, all of Calif.

[73] Assignee: Applied Materials, Inc., Santa Clara, Calif.

[21] Appl. No.: 664,657

[22] Filed: Oct. 25, 1984

[51] Int. Cl.[4] ............................................. C23C 14/00
[52] U.S. Cl. .............................. 204/192.23; 204/298; 204/192.25; 204/192.37; 118/723; 118/728; 118/50.1; 156/345; 156/643; 156/662; 427/38; 427/39; 427/47; 428/698; 428/702
[58] Field of Search ............................. 427/38, 39, 47; 118/723, 728, 50.1; 204/192 R, 192 EC, 192 C, 192 SP, 298; 156/643, 662, 345; 428/698, 702

[56] References Cited

U.S. PATENT DOCUMENTS

| | | | |
|---|---|---|---|
| 4,265,729 | 5/1981 | Morrison, Jr. | 204/298 |
| 4,273,800 | 6/1981 | Reid | 427/47 |
| 4,361,472 | 11/1982 | Morrison, Jr. | 204/192 R |
| 4,369,205 | 1/1983 | Winterling et al. | 427/39 |
| 4,487,162 | 12/1984 | Cann | 118/723 |
| 4,500,408 | 2/1985 | Boys et al. | 204/192 R |
| 4,500,409 | 2/1985 | Boys et al. | 204/192 R |
| 4,512,283 | 4/1985 | Bonifield et al. | 156/345 |

OTHER PUBLICATIONS

"Cylindrical Magnetron Sputtering", *Thin Film Processes,* Thornton et al., Chap. II—2, Academic Press, 1978, pp. 76–113.
IBM Tech. Disclosure Bulletin, "Method of Increasing the Deposition and Etch Ratesin Plasma Processes", by Hinkel et al., vol. 25, No. 7A, Dec. 1982, p. 3161.

*Primary Examiner*—R. L. Andrews
*Attorney, Agent, or Firm*—Flehr, Hohbach, Test, Albritton & Herbert

[57] ABSTRACT

A plasma CVD reactor and associated process use magnetic field enhancement to provide high quality, very high deposition rate metal, dielectric and conformal semiconductor films. The reacter and process are designed for automated, high-throughout, in-line small dimension VLSI integrated circuit fabrication, and are applicable to multistep in-situ processing.

22 Claims, 15 Drawing Figures

WAVELENGTH (na)

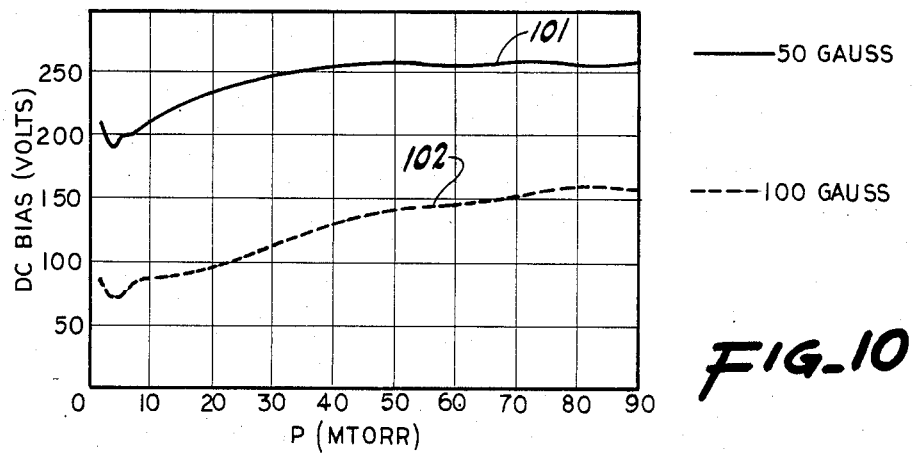
FIG_10
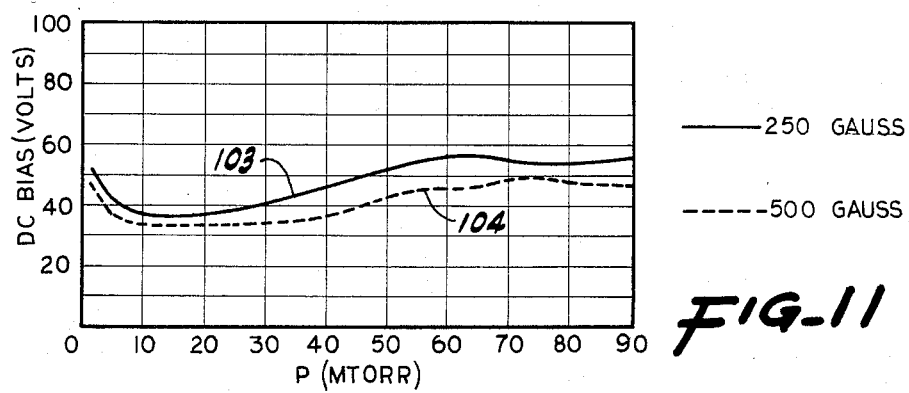
FIG_11

APPARATUS AND METHOD FOR MAGNETRON-ENHANCED PLASMA-ASSISTED CHEMICAL VAPOR DEPOSITION

BACKGROUND OF THE INVENTION

In one aspect, the present invention relates to magnetron-enhanced plasma-assisted chemical vapor deposition (CVD) reactors and associated methods for performing high rate deposition of dielectric, semiconductor and conductor films. In addition, the technique can be used for low temperature nitridation and oxidation. In still other aspects, the invention relates to apparatus and methods for performing in-situ multiple integrated circuit processing steps, and to deposition techniques for implementing conformal coatings and planarization.

The early gas chemistry deposition techniques which were applied to semiconductor integrated circuit fabrication used thermally-activated chemistry to deposit from a gas onto a heated substrate. Such chemical vapor deposition (CVD) of a solid onto a surface involves a heterogeneous surface reaction of gaseous species that adsorb onto the surface. The rate of film growth and the film quality depend on the surface temperature and on the gaseous species available.

More recently, plasma-enhanced low temperature deposition (and etching) techniques have been developed for depositing diverse materials, including metals such as aluminum and tungsten, dielectric films such as silicon nitride and silicon dioxide, and semiconductor films such as silicon.

The plasma used in the plasma-assisted CVD processes is a low pressure reactant gas discharge which is developed in an RF field. The plasma is, by definition, an electrically neutral ionized gas in which there are equal number densities of electrons and ions. At the relatively low pressures used in plasma-assisted CVD, the discharge is in the "glow" region and the electron energies can be quite high relative to heavy particle energies. The very high electron temperatures increase the density of disassociated species within the plasma which are available for deposition on nearby surfaces (such as substrates). The enhanced supply of reactive free radicals makes possible the deposition of dense, good quality films at lower temperatures and at faster deposition rates (300–400 Angstroms per minute) than are possible using purely thermally-activated processes (100–200 Angstroms per minute). However, the deposition rates available using plasma-enhanced processes are still relatively low. In addition, there are other difficulties associated with chemical vapor deposition and plasma-enhanced CVD processes. These difficulties are discussed below. Using plasma-assisted chemical vapor deposition, silicon nitride is formed from silane, nitrogen and ammonia reactants as follows:

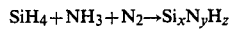

$$SiH_4 + NH_3 + N_2 \rightarrow Si_xN_yH_z \tag{1}$$

Undesirably, the concentration of hydrogen in the deposited silicon nitride can be as high as 25–35 atom percent. The presence of hydrogen in structures formed relatively early in the IC fabrication process and the hydrogen diffusion which results during subsequent high temperature fabrication steps can cause non-uniform electrical characteristics. In particular, as the layer thicknesses and spacings are decreased to provide increasingly dense integrated circuit structures, hot carrier injection problems associated with hydrogen make such high hydrogen content unacceptable. Even for final passivation films, the presence of hydrogen can create problems.

The trend toward ever greater device densities and smaller minimum feature sizes and smaller separations in VLSI integrated circuits imposes increasingly stringent requirements on the basic IC fabrication steps of masking, film formation (by deposition or growth), doping and etching. For example, it becomes increasingly difficult to form conformal coatings on stepped surface topography or to achieve planarization of interlevel dielectric layers, even when using plasma-enhanced CVD films. FIG. 1 represents a typical cross-section of an IC step topography in which a first film such as a conductor layer 11 has been formed over the existing stepped topography of a partially completed integrated circuit (not shown) and is undergoing the deposition of an interlayer dielectric layer 12 such as silicon dioxide. This is done preparatory to the formation of a second level conductor layer (not shown). Typically, where the mean free path of the depositing active species is long compared to the step dimensions, (and where there is no rapid surface migration) the deposition rates at the bottom 13, sides 14 and top 15 of the step topography are proportional to the associated arrival angles. Since the bottom surface arrival angle is a function of the depth and width of the trench, the thickness of the deposited layer at the bottom 13 of the trench tends to be less than that at the sides 14 which, in turn, is less than the thickness at the top 15.

Increasing the pressure used in the deposition process would increase the collision rate of the active species and decrease the mean free path. This would increase the effective size of the arrival angles and increase the deposition rate at the side walls 14 and bottom 13 of the trench. However, and referring to FIG. 2A, this would also increase the arrival angle and associated deposition rate at the step corners 16. For steps separated by a wide trench, the resulting inwardly-sloped film configuration and the associated cusps 17 provide a less than ideal coverage. Nonetheless, the film topography can be made planar (to facilitate formation of the subsequent second level conductor layer) by the use of conventional planarization techniques. In contrast, and referring to FIG. 2B, where the steps are separated by a narrow trench, for example in dense 256 kilobit VLSI structures, the increased deposition rate at the corners 16 encloses a void 18. The void is exposed by a subsequent planarization procedure and allows the second level conductor to penetrate and run along the void and short the conductors and devices along the void.

Thus, the current state-of-the-art of the plasma-assisted CVD technique can be summarized as follows. Plasma-assisted CVD reactors provide maximum deposition rates of approximately 300–400 Angstroms. However, problems exist in meeting the needs of future plasma deposition technology, for example in eliminating or decreasing high hydrogen impurity levels in plasma CVD nitride films and in the difficulty in achieving conformal step coverage and effective planarization in the topography of small-dimension VLSI devices.

The requirements for any successful future plasma deposition technology are several. The capability for forming low hydrogen silicon nitride and the requirements of topography in terms of step coverage and planarization have been mentioned. In addition, the capability for forming interlevel plasma oxide films as well as low hydrogen-content oxynitride films is desirable. Oxynitride films have different dielectric properties from oxides and nitrides and are being implemented as gate dielectrics in both volatile and nonvolatile IC technologies. Furthermore, it is desirable to have the capability to form interconnects and metalization of materials such as silicides, aluminum and refractory metals. Increasingly, and in particular as multi-level mask conductor and dielectric structures are implemented, it is desirable to have an in-situ process which is capable of performing a multiplicity of steps without removing the wafer from the chamber by simply changing the reactant gas chemistry and operation conditions. This latter statement is demonstrated by two examples.

Consider first the use of silicon nitride as a passivation layer. As mentioned, low-hydrogen content nitride is desirable to eliminate hot carrier problems, but low-hydrogen nitride films can be highly stressed. One approach which permits the use of low-hydrogen nitride passivation layers is to first deposit phosphosilicate glass (PSG) to alleviate the stress, then deposit the low-hydrogen content nitride. Obviously, throughput would be increased and the defect density would be decreased if the two deposition steps could be performed in the same reactor.

A second example involves the use of aluminum. Sputter-deposited aluminum is the favorite metal for interconnects despite the several problems associated with its use. For example, pure aluminum undergoes electromigration which causes cracks, voids, etc. Aluminum also forms hillocks or columns which can punch through insulating layers. It is possible to dope aluminum with copper to decrease electromigration, but copper itself is very hard to etch. A better solution is to form a multi-layer structure of aluminum/tungsten/aluminum. Again, throughput would be increased by using chemical vapor deposition to deposit the three layers in the same reactor. Perhaps more important than all is that CVD aluminum will have much better step-coverage than sputter-deposited aluminum films.

Furthermore, in implementing the dense, complex, process-sensitive present and future integrated circuits structures, it is and will be desirable to have a plasma deposition technology which is adaptable to automatic cassette-to-cassette wafer handling, both for off-loading wafers from the cassette into the processing chamber and returning the wafers to the cassette after processing.

Finally, throughput and particulate control will be helped by the use of load lock mechanisms. Load lock mechanisms not only decrease pumping and processing time, but also decrease exposure of the very susceptible VLSI structures to contaminants.

SUMMARY OF THE INVENTION

Objects

In view of the above discussion, it is an object of the present invention to provide apparatus and methods for high-rate plasma deposition of dielectric and metal and semiconductor films.

It is another object of the present invention to provide the described high rate deposition as part of a multiple step processing sequence within the same processing chamber.

It is still another object of the present invention to provide apparatus and methods for forming conformal film coverage on varied integrated circuit topographies such as step structures.

It is still another object of the present invention to provide apparatus and methods for performing simultaneous plasma deposition and etching of a surface for the purpose of selectively optimizing film characteristics such as the ability to form conformal coatings and planarization.

SUMMARY

The above and other objectives are accomplished by the application of a magnetic field to assist and enhance plasma chemical vapor deposition. The application of magnetic fields parallel to a work surface is known to be efficient in magnetron solid sputtering technology and in gas chemistry etching, but previously has not been applied to gas chemistry deposition. The low pressures required in gas chemistry processes conventionally permit only a low concentration of plasma reactant species and a corresponding low deposition rate. However, we have found that the appropriate application of a magnetic field in conjunction with plasma CVD techniques provides very high deposition rates of dense, high quality films at very low pressure and low substrate temperatures and with excellent uniformity. The technique is applicable to the deposition of a wide range of metal, insulator and conductor film compositions, including the formation of low-hydrogen-content silicon nitride films at high deposition rates, and is uniquely suited to the formation of conformal films.

In one specific aspect, the present invention is embodied in a method for forming a selected film on a substrate by adsorption from a reactant gas plasma by placing the substrate on a cathode within a vacuum processing chamber, establishing a reactive gas plasma adjacent the cathode, and applying a uniform magnetic field within the chamber substantially parallel to the cathode to confine the motion of the electrons and enhance the electron density adjacent the substrate surface.

In another aspect, the present invention relates to a method of plasma vapor deposition which involves providing a substrate support electrode in a vacuum processing chamber, evacuating the chamber, introducing a reactant gas to the chamber and applying RF power to the chamber to generate a plasma from the deposition gas, and applying a variable magnetic field to the chamber substantially parallel to the electrode, to establish a selected chemical reaction of the substrate surface with the reactive gas plasma.

In still another aspect, the invention relates to a magnetic field-assisted vacuum deposition reactor, comprising a vacuum chamber having a gas inlet adapted for supplying reactant gas to the chamber; an electrode within the chamber having at least a surface adapted for supporting a substrate; vacuum means for exhausting the chamber via an outlet; a power supply operatively connected to the electrode for creating a deposition plasma from the reactant gas for deposition onto a surface of the substrate; and magnetic field generating means configured to provide a directed magnetic field within the chamber for concentrating the deposition gas plasma reactant species adjacent the substrate and controlling the kinetic energy of the ions impinging on the wafer surface from the deposition gas plasma.

BRIEF DESCRIPTION OF THE DRAWINGS

The above and other aspects of the present invention are described in conjunction with the drawings, in which:

FIGS. 10 and 11 graphically illustrate DC bias voltage as a function of pressure for selected operating conditions of the reactor system of FIG. 3.

DETAILED DESCRIPTION OF THE INVENTION

Figures 3, 5:
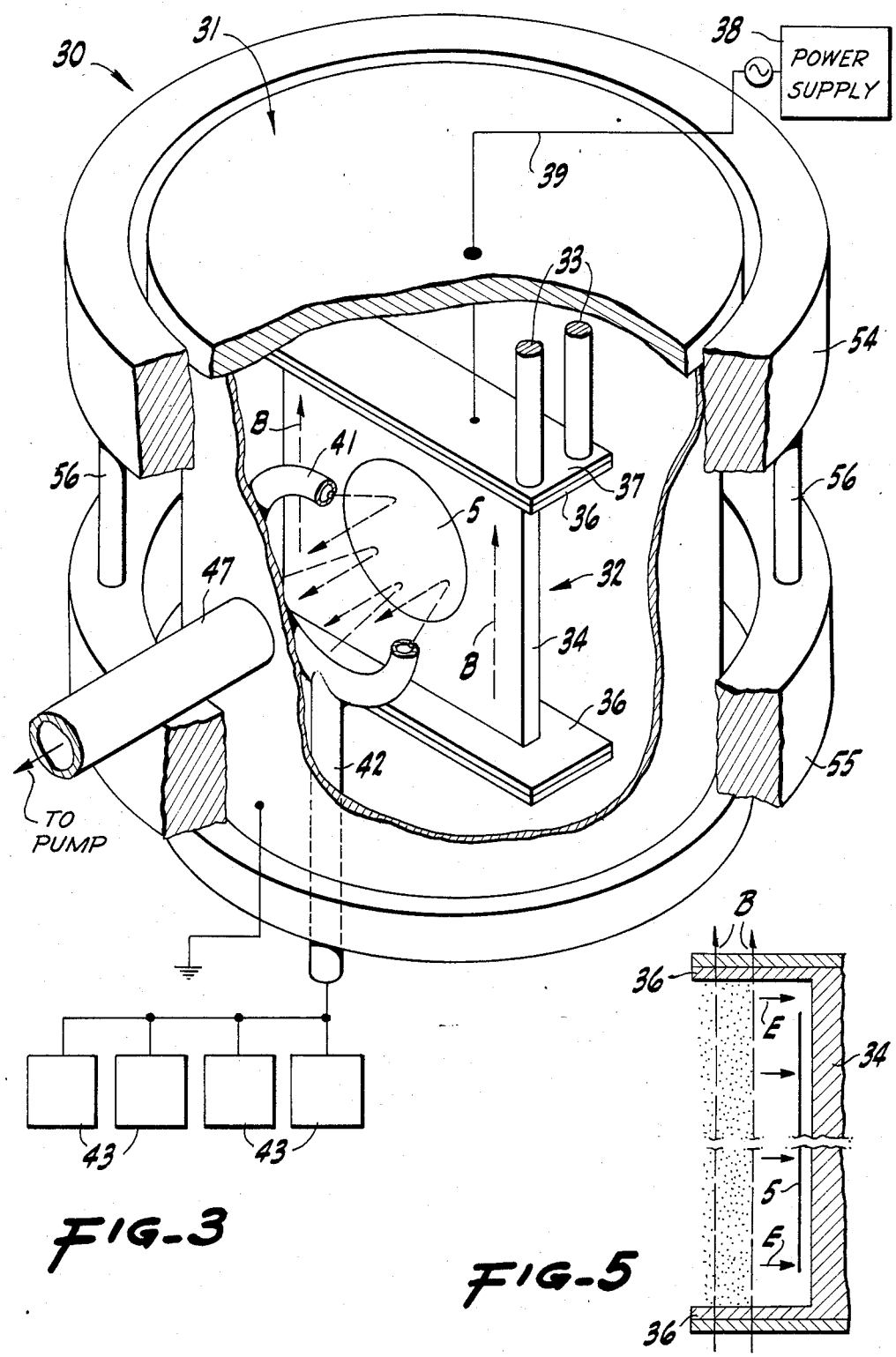
FIG. 3 is a perspective view, partly in schematic form and partially cut-away, of a magnetron reaction system which is constructed in accordance with the principles of the present invention.
FIG. 5 is an enlarged partial view of the electrode cross-section shown in FIG. 4, schematically illustrating the magnetic field lines which confine electrons adjacent the electrode surface.

FIG. 3 illustrates a magnetron reaction system 30 which is constructed in accordance with the present invention. The system 30 includes a cylindrical stainless steel vacuum chamber 31 which mounts a band cathode assembly 32 therein. The cathode 32 is insulatingly mounted within and insulated from the chamber 31 by insulating mounting posts 33—33. In a preferred embodiment, the cathode 32 comprises a central axial section 34 and inner end reflector sections 36—36 which are formed of aluminum or other conductive non-magnetic material. Outer end sections 37—37 are formed of insulating material, such as Maycor ®. Power is supplied for effecting plasma operation by an RF system 38 which includes an RF power supply and load matching network, and is connected to the cathode 32 by insulated power lead 39.

Reactant gas is applied to the chamber 31 by one or more gas manifold rings 41 via an inlet shaft 42 from a gas supply system. This system includes a number of gas storage tanks or reservoirs 43—43 which supply gases through line 42 to the inlet manifold ring 41.

Figure 4:
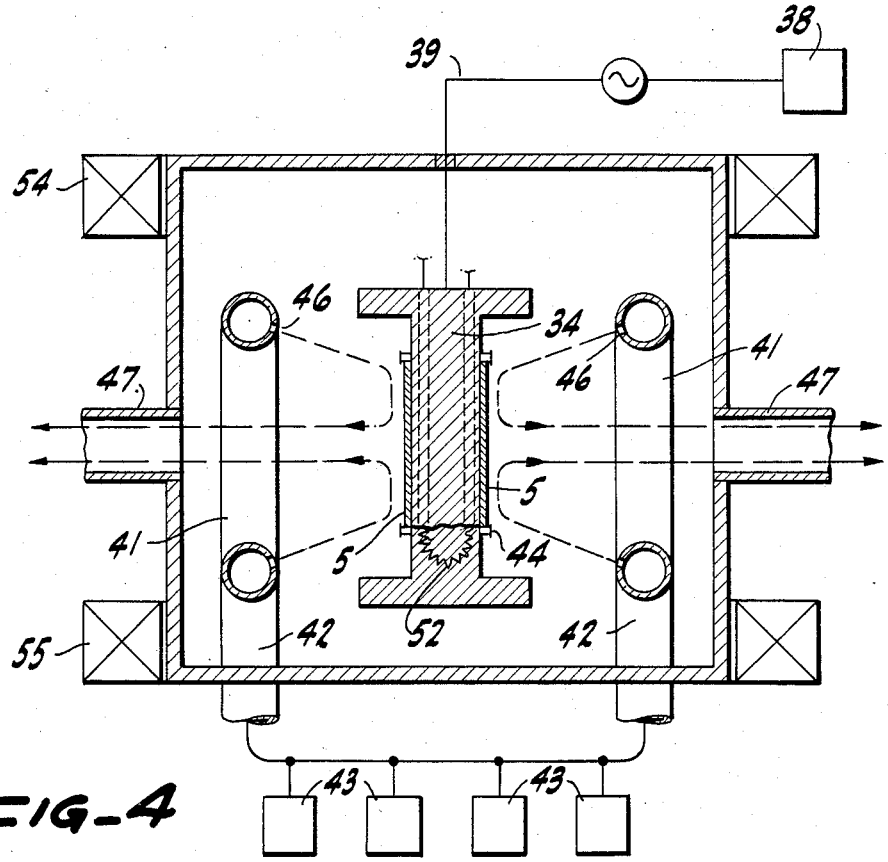
FIG. 4 is a cross-sectional view of the reactor of FIG. 3.

Referring also to the cross-sectional view of the cathode 34 and inlet manifold ring 41 shown in FIG. 4, a semiconductor wafer is positioned by means 44, such as clips, to the side of the cathode (or may be mounted or held within a recess (not shown) in the cathode). In a presently preferred arrangement, a gas ring 41 is provided for each wafer or substrate 5. Alternatively, the gas ring can be mounted on the cathode. The diameter of the gas ring 41 is slightly larger than the diameter of the associated substrate 5 and the ring apertures 46 are formed toward the inside of the ring so that the manifold directs reactant gas at a slight angle onto the substrate. This provides an even gas flow across the substrate surface and off the substrate, through the ring and to an exhaust outlet 47 in the chamber wall which is aligned with the ring and the wafer. The outlet 47 is connected to a mechanical pump (not shown) via a vacuum valve and Roots blower. This arrangement facilitates uniform coverage and processing of the substrate by the reactant gas. This arrangement also decreases the inherent tendency of reaction chambers to form on the relatively cool inner chamber walls deposits which can be redeposited on the substrate as contaminants. While other inlet means can be used, such as nozzles and apertured flat manifolds, the ring configuration is preferred for its uniform gas distribution and suppression of wall deposits. Control of the system can be provided via a capacitance manometer sensor which operates through a pressure control system and DC motor to control the speed of the blower.

Although only one substrate 5, inlet manifold 41 and exhaust outlet 47 are shown in FIG. 3 to facilitate illustration, preferably two of each (or more) are used, as shown in FIG. 4. The number used depends upon the available mounting space or surfaces in the particular implementation of the cathode 32. Typically the cathode has a two-sided configuration as shown in FIGS. 3 and 4, or is a polygon. However, as described below, the magnetic field within the chamber is uniform and as a consequence other electrode shapes can be used.

The system 30 is operable to deposit films at room temperature, i.e. without heating of the substrate 5 by means other than the deposition reaction. However, as shown in the cross-sectional view of FIG. 4, in one working embodiment, the cathode body 34 has heating means 52 therein, such as an electric resistance filament for uniformly heating the substrates 5 to enhance film quality. The maximum heating requirements, 250° C., are lower than the temperatures used in plasma CVD. The RF energy could be used to heat the substrate support and the substrate. Cooling fluid, such as nitrogen gas, can also be provided to the interior of the cathode body 34 to facilitate control of the substrate temperature.

Electro-magnets 54—54, typically formed of copper coil (not shown), are circumferentially positioned about the chamber 31 near the top and bottom thereof. The electromagnets form north and south poles which are reversible by reversing the coil current. In particular, the chamber dimensions and coils form a Helmholtz configuration in which the coil separation, which is precisely maintained by mounting standoffs 56—56, is approximately one-half the coil diameter. In this configuration, the electromagnets form a uniform magnetic field over substantially the entire diametrical cross-section of the chamber. The parallel magnetic field lines, indicated by arrows B—B, are substantially parallel to the cylinder axis. In positioning the cathode 34 and the substrate 5 parallel to the cylinder axis (the cathode is transparent to the magnetic field lines), the magnetic field lines are formed parallel to the substrate surface.

Referring to FIGS. 4 and 5, during deposition operation of the reactor system 30, selected gas or gases are inlet from the reservoir 43—43 via line(s) 42 and from there through the inlet ring manifold(s) 41 to the reaction chamber 30, which is evacuated by the exhaust pump system.

Application of RF power from the power supply 38 creates a low pressure, reactant gas discharge or plasma of electrons, ions and disassociated species in the vicinity of the substrate 5. As shown schematically in FIG. 5, an electric field E is formed across the plasma shield or dark space directed from the positive potential plasma toward the surface of the electrode section 34. This field accelerates electrons across the sheath away from the electrode surface and accelerates positive ions across the sheath toward the electrode 34.

At the same time, the uniform magnetic field is applied to the chamber parallel to the substrates 5 and perpendicular to the electric field. The electrons are confined by the magnetic field lines in that the magnetic field lines prevent the electrons from moving easily from the cathode 34 to the anode 31. Also, the magnetic and electric fields impart an $\vec{E}\vec{x}\vec{B}$ drift velocity to the electrons such that they tend to drift and to jump from point to point along the cathode surface. The electrons are concentrated in a band having a net drift velocity along the cathode and substrate. In conjunction with the end reflectors 36—36, the $\vec{E}\vec{x}\vec{B}$ drift velocity tends to confine the electrons within the plasma. The theory and explanation of the effect of magnetic fields in confining electrons is known. However, the application of this principle to chemical deposition has not been done, and there is no suggestion that it could be done with a very high deposition rate at the very low system pressure (about 200 millitorr maximum) which is an inherent limitation of magnetic-assisted plasma systems.

Figure 6A:
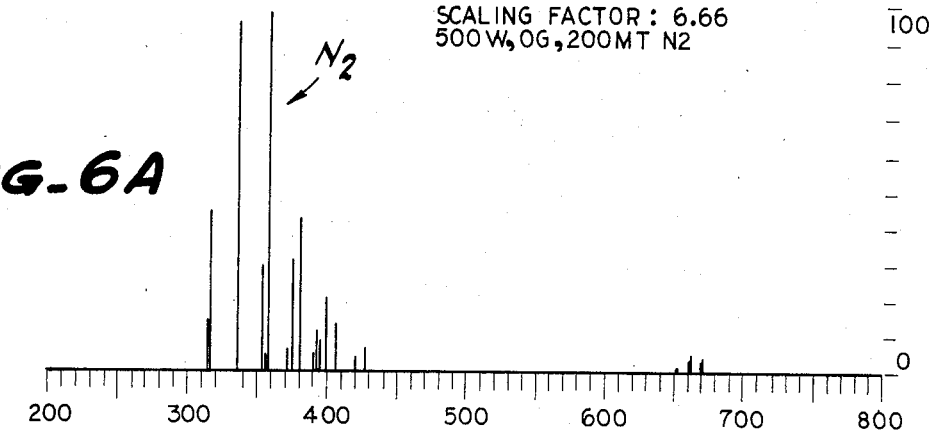
FIGS. 6A, 6B and 6C illustrate the intensity of the spectral response of the active nitrogen species present in the plasma at different values of the magnetic field.
Figure 6B:
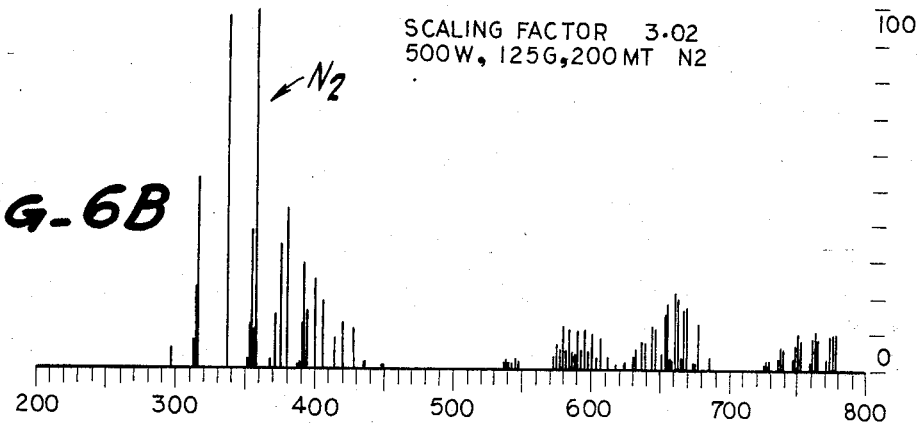
Figure 6C:
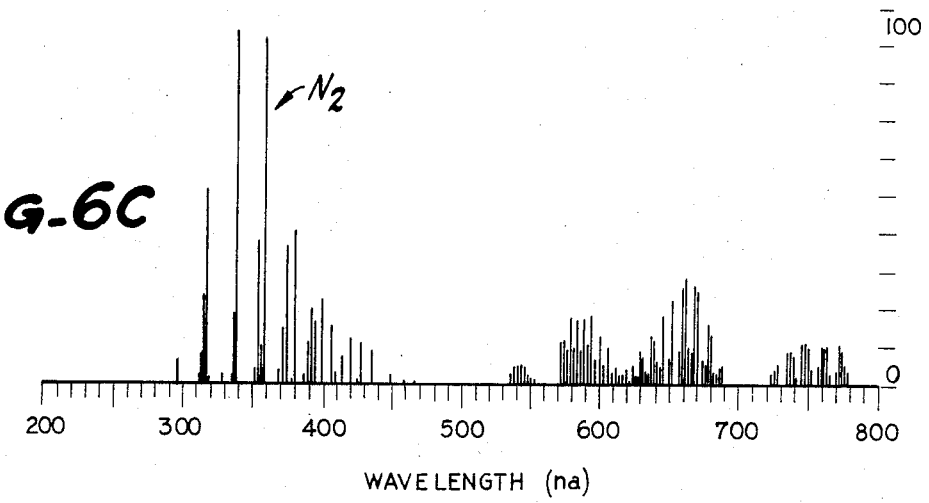

The surprising effectiveness of the magnetic field and the reactor 30 in increasing the number density of electrons and, as a consequence, the density of reactive species available for reaction at the substrate 5 is evidenced in FIGS. 6A through 6C. These figures show the intensity of the spectral response of the active nitrogen species present in a nitrogen plasma at different values of the magnetic field. In each case, the nitrogen plasma was formed using 200 millitorr pressure and 500 watts RF power. The field intensity was 0 G (Gauss), 125 G and 250 G, respectively, for FIGS. 6A, 6B and 6C. The respective scaling factors of 6.66, 3.02 and 1.6 which were required to equalize the nitrogen spectral intensities for the 0, 125 G and 250 G magnetic field values suggest that the available active nitrogen species increased above the base value shown in FIG. 6A in proportion to the increase in the magnetic field.

The enhanced availability of active nitrogen species permits nitrogen gas to be used without ammonia for the deposition of silicon nitride and silicon oxynitride. It is highly desirable to use nitrogen for plasma nitride/oxynitride deposition because it provides a relatively low hydrogen film content. However, nitrogen is relatively inactive and conventionally provides unacceptably low deposition rates in plasma CVD deposition. Consequently, ammonia, $NH_3$, is used for nitride/oxynitride deposition, despite the resulting high hydrogen film content. To our knowledge, the present magnetron-enhanced plasma deposition process is the only gas chemistry process which provides low hydrogen film content and high deposition rates in combination with excellent film quality.

Figure 7:
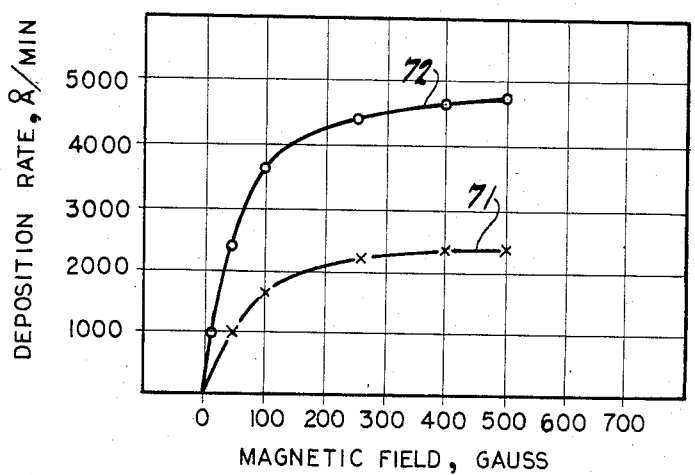
FIGS. 7 and 8 graphically illustrate silicon nitride deposition rates as a function of magnetic field and total reactant gas flow, respectively, for selected operating conditions of the reactor system of FIG. 3.

Another advantage of the present invention relates to the high deposition rate at low pressure and to the availability of a variable magnetic field for process optimization. These are illustrated, for example, by the silicon nitride deposition curves 71 and 72 shown in FIG. 7. The data points for curves 71 and 72 were taken using relative flow rates, respectively, of 10% $SiH_4$/90% $N_2$ and 50% $SiH_4$/50% $N_2$. Despite the low, 10 millitorr pressure which was used, very high deposition rates were obtainable, and the deposition rate range of 0–5,000 Angstroms per minute was an asymptotic function of the associated magnetic field range of 0–500 Gauss.

Figure 8:
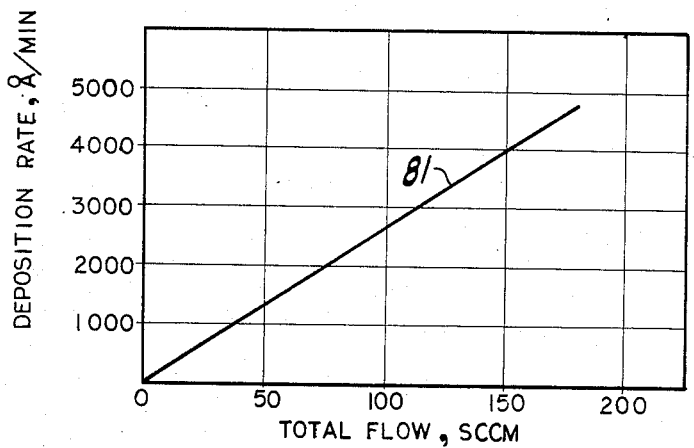

Referring to FIG. 8, curve 81 is a plot of silicon nitride deposition rate as a function of total reactant gas flow. This figure demonstrates that high deposition rates are available as a function of reactant gas flow at low pressure. The data of FIG. 8 were taken at 500 watts, 250 G, 300° C., using 50% $SiH_4$/50% $N_2$ gas flow and a low, 10 millitorr pressure. The maximum deposition rate of approximately 4,000 Angstroms per minute was achieved at a total gas flow of approximately 150 SCCM and the deposition rate range of 0–4,000 Angstroms per minute was associated with a total reactant gas flow rate range of 0–150 SCCM.

Another advantageous aspect of the present magnetron-enhanced plasma-assisted CVD technique is the capability for high deposition rates (described above) which are obtained at low DC bias independent of pressure, and with low defect densities in the deposited films. To explain, consider first the well-known fact that low DC bias and the resulting relatively low-energy ion bombardment result in low substrate and film defect densities.

Figure 9:
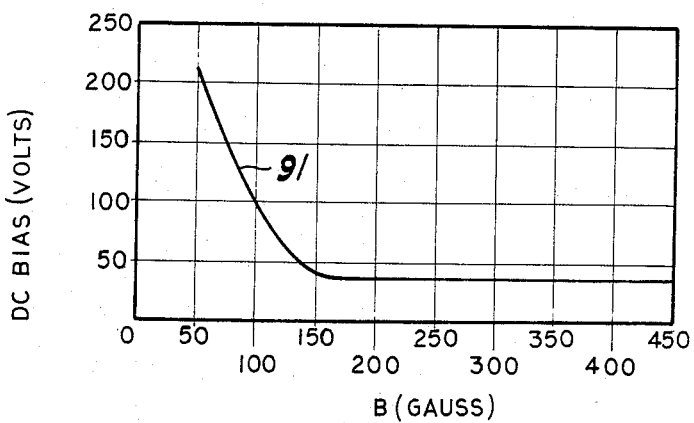
FIG. 9 graphically illustrates DC bias as a function of magnetic field for selected operating conditions of the reactor system of FIG. 3.

Furthermore, the FIG. 9 curve 91 of DC bias as a function of magnetic field illustrates that the bias voltage of system 30 (which results from the application of the magnetic field) decreases with increasing magnetic field to a relatively constant value for $B \geq 150$ Gauss. Thus, increasing the magnetic field to obtain high deposition rates (see FIG. 7) also has the benefit of providing an associated decreased DC bias voltage level and low defect densities. In addition, the curves 101, 102, 103 and 104 shown in FIGS. 10 and 11 illustrating DC bias as a function of pressure at 50, 100, 250 and 500 Gauss indicate that DC bias is relatively constant over the investigated range of chamber pressures. Thus, the relatively high deposition rates provided by the present reactor system 30 and deposition technique are provided at low DC bias, with associated low defect densities, and are relatively independent of pressure. This permits the use of low pressure in situations where high pressure is undesirable.

Deposition

The high deposition rate provided by the present invention is accompanied by excellent film quality and excellent conformal qualities. While a permanent magnet arrangement is applicable to the equipment design to provide quality films, the variable magnetic field which is provided by the electromagnets 54 and 55 is important in providing the ability to tailor the deposition conditions to the particular film and other requirements.

An experimental program was set up to demonstrate the deposition process. Silicon nitride ($Si_xN_y$), silicon oxynitride ($Si_xO_yN_z$) and silicon dioxide ($SiO_2$) were deposited on monocrystalline silicon films using the general method described above and the process parameters described in Table 1 below. Two different sized reactor chambers 30 were used, with like results. Both used the Helmholtz magnet configuration. The first chamber was 12 inches in diameter by 12 inches in height, with magnet dimensions of approximately 12 inches inside diameter and 6 inches separation. The second chamber 30 measured 18 inches in inside diameter by 15 inches in height and the associated magnets were approximately 18 inches in inside diameter with a separation of approximately 9 inches.

As mentioned previously, the silicon nitride films were formed using $SiH_4/N_2$, i.e., without ammonia, $NH_3$. The silicon oxynitride and silicon dioxide films were formed using $SiH_4/N_2/N_2O$ and $SiH_4/N_2O$, respectively. Equal $N_2$ and $N_2O$ flow rates were used in the oxynitride deposition, but those of ordinary skill in the art understand that the $N_2/N_2O$ flow rate ratio can be varied to control the oxynitride composition.

The films were characterized as follows: An indication of the stoichometry of the films was obtained by measuring the refractive index ($N_f$) using an Ellipsometer. Film thickness was determined using four-point probe measurements. Film thickness values were then used with the deposition times to obtain the deposition rates. The amount of film stress was determined by measuring the net radius of curvature of the wafer after deposition. The films were also wet-etched in buffered hydrogen fluoride (BHF) etching solution (13:2 $NH_4$:HF) at 25° C. to provide an indirect estimate of film density and quality. A relatively low BHF etch rate of, respectively, up to about 50/900 Angstroms per minute for silicon nitride/silicon dioxide is generally considered to be indicative of a high quality, dense film.

TABLE 1
DEPOSITION

| Parameters | Film $SiO_2$; $Si_xO_yN_z$ | $Si_xN$ |
|---|---|---|
| RF Power | 400–1000 watts | 400–1000 watts |
| Magnetic Field | 25–200 gauss | 25–100 gauss |
| D.C. Bias | 50–250 volts | 50–250 volts |
| Pressure | 2–100 millitorr | 2–100 millitorr |
| Gas System | $SiH_4/N_2O$; $SiH_4/N_2/N_2O$ | $SiH_4/N_2$ |
| Total Flow | 100–800 SCCM | 100–800 SCCM |
| Temperature | 20–300° C. | 20–300° C. |

Referring to Table 2, for the deposited silicon nitride, silicon oxynitride, and silicon dioxide films, the measured refractive indices and film composition values were well within the acceptable range.

Nuclear reaction analysis and IR analysis also indicated a low hydrogen content of 5–13% for the silicon nitride films. In addition, the BHF etch rate of 20 to 70 Angstroms per minute is consistent with the 50 Angstroms per minute value which is representative of dense high quality silicon nitride films. The 20–70 Angstroms per minute etch rate is taken as evidence that the deposited silicon nitride films were of very high quality and density. Furthermore, the adhesion of the silicon nitride films was excellent. The silicon nitride film compressive stress was about $5 \times 10^9 - 1 \times 10^{10}$ dynes per square centimeter. This value is believed characteristic of the high density, high adhesion, low hydrogen content of the silicon nitride films. Finally, the deposition experiments indicated good quality silicon nitride films can be deposited at room temperature by increasing the power to compensate for the lack of supplemental heating. Below about 100° C., high quality films were obtained for pressures $\leq 30$ mtorr for power levels $\geq 400$ watts. Also, above about 100° C., the high film quality was insensitive to temperature over the range of process variables.

TABLE 2
DEPOSITED FILM CHARACTERISTICS

| Characteristic | Film $Si_xN_y$ | $Si_xO_yN_z$ | $SiO_2$ |
|---|---|---|---|
| $N_f$ | 1.7–2.0 | 1.6 | 1.48 |
| Auger, % Si | 40 | 30 | 33 |
| O | 5 | 50 | 62 |
| N | 55 | 20 | 5 |
| Stress (dyne/cm$^2$) | $5 \times 10^9 - 1 \times 10^{10}$ | $1 \times 10^{10}$ | $(4.5–7.5) \times 10^9$ |
| Deposition Rate (Å/min) | ~1000–5000 | ~1000–5000 | ~1000–4750 |
| Etch Rate (Å/min) | 20–70 | 400 | 1040–1140 |
| H content | 5–13% | 3–8% | — |
| Adhesion | Excellent | Excellent | Excellent |
| Step Coverage | " | " | " |
| Thickness Uniformity | <5% | <5% | <5% |

For the silicon oxynitride films, the etch rate of 400 Angstroms per minute is again relatively low compared to the values of perhaps 1,000–2,500 Angstroms per minute, depending upon the oxygen content, which are associated with dense films, again suggesting the films were of high quality and were dense. Deposition rates were 1,000–5,000 Angstroms per minute. Hydrogen content was low, about 3–8%, and adhesion was excellent. The films did not exhibit cracking or wrinkling.

Finally, the deposited silicon dioxide films exhibited an etch rate of about 1,040 to 1,140 Angstroms per minute, indicating a good quality dense film. It is worth noting that the BHF etch rate for quality thermal silicon oxide films (which are formed slowly and require that the IC structure be subjected to relatively high temperatures of about 800° to 900° C. for long periods of time) is about 900 Angstroms per minute. The thermal oxide-quality of the present, magnetron-enhanced plasma oxide films is provided at low temperatures and extremely short deposition times (because of the very high deposition rate of approximately 1,000 to 5,000 Angstroms per minute). In consequence, the existing IC structure is not subjected to high temperature for long periods of time, as is the case with the formation thermal silicon oxide films.

Furthermore, for silicon oxide films the films were in compression. The compressive stress values were within the range $(4.5–7.5)\ 10^9$ per square centimeter, and in general there was no film cracking or wrinkling.

It should be noted that some film cracking was observed where process pressures were below approximately 5 millitorr and there was evidence of gas phase reaction at about 50 millitorr. The former problem can be avoided by adjustment of the magnetic field whereas the latter is a function of the chamber configuration, power and flow rate.

It should be noted that the range of deposition rates of about 1,000–5,000 Angstroms per minute for the nitride, oxynitride and oxide films was a function of magnetic field intensity and gas flow rate, with the higher deposition rates being provided by the higher magnetic field values and/or gas flow rates. Furthermore, the investigations conducted to date indicate the 5,000 Angstrom maximum value is not the upper limit. The experimental data suggests that increasing the magnetic field, or increasing gas flow at a given pressure will provide even higher deposition rates of quality films.

Conformal Step Coverage

Figure 1:
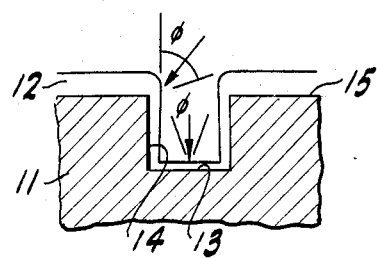
FIG. 1 is a schematic cross-sectional representation of an integrated circuit which illustrates the arrival angles associated with the deposition of a layer of material such as dielectric onto a surface of stepped topography.
Figure 2A:
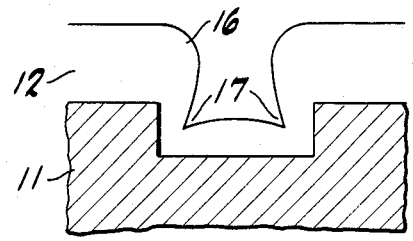
FIGS. 2A and 2B are schematic cross-sections, similar to FIG. 1, which illustrate the effect of trench width on planarization.
Figure 12:
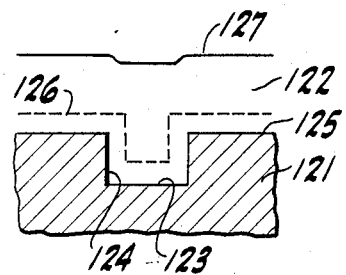
FIG. 12 is a cross-section of the surface topology of an integrated circuit, in the manner of FIG. 1, illustrating the conformal, planar qualities of oxide and nitride films deposited using the reactor system of FIG. 3.
Figure 2B:
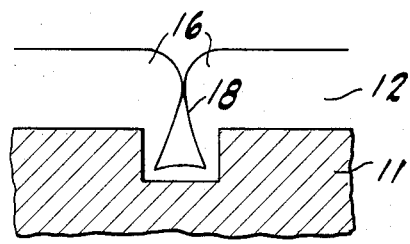

As mentioned above, the ability to form conformal and planarized films on small dimension dense topographical features, is very important to current and future IC deposition technology. An experimental program was established to investigate the conformal and planarization qualities of magnetron-enhanced plasma silicon nitride and silicon dioxide films. Referring to FIG. 12, the oxide and nitride films 122 were formed to a thickness of one micron on stepped silicon conductor films 121 which were formed with line widths of 0.5-2 microns and step heights of one micron and were separated by 1.5-2 micron-wide trenches. The reactor 30 was used in accordance with the method described above. The Table 1 deposition parameters were used to deposit the silicon nitride and silicon oxide films. In addition, silicon oxide films were formed by adding $NF_3$ or $CF_4$ etching gas to the chamber simultaneously with the deposition gas. Both etching and deposition proceed more slowly on the bottom walls 123 and sidewalls 124. Consequently, etching simultaneously with deposition was used to enhance conformal film formation, i.e., to control the step coverage profile by offsetting any differences in deposition rates on the different surfaces and, thus, equalizing film thickness on the bottom 123, sidewalls 124 and top surfaces 125. It was also used to control the deposition rate.

The step coverage was characterized using SEM (scanning electron micrographs). As shown by the FIG. 12 schematized illustration of the resulting deposited silicon nitride and silicon oxide films 122, the step coverage was quite conformal for both film types (1) and (2). Early in the two-micron growth process, the film thickness at the bottom 123, sidewalls 124 and top surfaces 125 was equal, as indicated by the dotted line 126. The bottom surface cusps and voids associated with conventional plasma deposited films were absent. In short, despite the close step spacing, conformal silicon nitride and silicon dioxide films were obtained. Then, as film deposition continued, a nearly flat, planar upper surface 127 was formed.

The observed uniform film thickness is thought to be the result of high surface mobility. Please note, the peak-to-peak voltage and the DC bias for given conditions are typically less using a magnetic field than for a zero magnetic field and in consequence the average energy of ions impinging on the substrate 5 (along with substrate and film defect densities) is also lower. Nonetheless, the very high number density of active chemical species arriving at the substrate surface is believed to result in a high surface mobility which provides a uniform film growth. Conformal step coverage is also aided, that is the tendency to form uniform a film of uniform thickness over the top, bottom and sides of steps is increased, as the pressure is decreased, down to a value of at least about 5 millitorr. Variation of the pressure provides control of the profile of the deposited film by in-situ physical sputtering of the film. The mean free path of species arriving at the substrate surface varies with pressure and becomes more unidirectional at low pressure, reducing the film thickness on the edge and top of step coverage due to in-situ physical sputtering.

In addition to the use of various parameters as discussed above to control film growth rate, conformal coverage and various film characteristics, film stress can be controlled by varying the magnetic field. The effect of magnetic field variation on stress in nitride films was investigated. Low frequency fields (about 50–450 kilohertz) provided higher film stress than did higher frequency fields (about 13–27 megahertz), typically with enhanced adhesion. Low stress, good adhesion nitride films were provided by starting deposition using a low frequency magnetic field, then switching to a high frequency magnetic field. The initial deposition at low frequency provides excellent adhesion to the underlying material, while the stress is a weighted average based upon film thickness. It is expected that the stress benefits would be obtained by using an initial high frequency and switching to a low frequency field, but perhaps with some reduction in adhesion.

Adhesion and stress were also optimized in nitride films by applying a mixed high and low frequency magnetic field. In this case, good adhesion was again obtained and the stress was a weighted average based upon power.

As suggested by the above step coverage processing, because of the high deposition rate associated with the magnetron-enhanced plasma films and the ability to simultaneously deposit and etch and to change from deposition to reactive ion etching by changing the gas chemistry, planarization can be readily implemented by the simple expedient of growing a thick dielectric nitride or oxide film and, if further planarization is desired, changing to an etching gas composition and etching back the film to a smooth planar top surface.

Various alternative instructions for the chamber 30 will be implemented by those skilled in the art to take advantage of the process versatility provided by the variable magnetic field, RF power, pressure, flow rate and temperature. Certainly the chamber 30 is not limited to a parallel plate electrode configuration or to a single or dual substrate and gas inlet manifold arrangement. Because the magnetic field is substantially uniform over the diametrical cross-section of the chamber, any cathode configuration can be used which orients the substrates parallel to the magnetic field. This would include multi-faceted, polygonal cathode configurations in general. In addition, an adjustable anode can be implemented which contains both gas distribution and cooling features As mentioned previously, the present and future requirements of IC deposition technology include the ability to deposit high quality films at high product yields with controlled step coverage (topography) and low defect, particulate and pin-hole densities, preferably in an automated, cassette-to-cassette load lock system which occupies small floor space and has the ability for multi-step in-situ processing. The above-described magnetron-enhanced plasma chamber and process meet the basic requirements which are necessary to fulfill these objectives: low pressure, single wafer loading, controllable low ion bombardment of the substrate, inherent high-quality and selectable process variability.

What is claimed is:

1. A gas chemistry method for depositing a selected film on a substrate from a reactant gas plasma, comprising providing a vacuum chemical vapor deposition chamber having an axis and including an electromagnet arrangement adapted for providing a uniform variable strength magnetic field throughout the chamber parallel to the cylinder axis; placing the substrate on a cathode within the vacuum chamber oriented parallel to said axis; applying RF energy to said chamber for forming a DC bias filed perpendicular to said axis; and forming a deposition reactant gas plasma within the chamber while applying said magnetic field substantially parallel to said axis and the substrate to form the film on the substrate.

2. A method for depositing a selected film on a substrate from a reactant gas plasma, comprising placing the substrate on a cathode within a vacuum processing chamber; applying RF energy to said chamber for forming a DC bias field perpendicular to said substrate; and forming a deposition reactant gas plasma within the chamber while applying a magnetic field substantially parallel to the substrate to form the film on the substrate, the magnetic field being variable for providing a high film deposition rate and low bombardment energy and associated low defect density.

3. A gas chemistry method of plasma vapor deposition, comprising providing a vacuum chemical vapor deposition chamber having an axis, providing a substrate support electrode in said vacuum chamber oriented and for orienting the substrate parallel to said axis, evacuating the chamber, introducing reactant deposition gas to the chamber, applying RF power to the chamber to form an electric DC bias field perpendicular to said axis to generate a plasma from the reactant gas adjacent the electrode surface, and applying a magnetic field to the chamber from an external source parallel to said axis to provide an electron-trapping field adjacent the electrode to establish a selected chemical reaction of the substrate surface with the reactant gas plasma, said reactant gases being provided to said chamber in an inlet pattern corresponding to the peripheral configuration of said substrate for sweeping the gas inwardly across said substrate and exhausting said gas through said inlet pattern.

4. The method of claim 1 wherein the pressure is varied to control the profile of the deposited film by in-situ physical sputtering of the film.

5. The method of claim 1 wherein the magnetic field is varied to control film characteristics.

6. The method of claim 1 wherein the magnetic field is varied to control film stress.

7. The method of claim 1 wherein the magnetic field is changed from low to high frequency during deposition to control stress in the deposited film and ahdesion to said substrate.

8. The method of claim 1 wherein a mixed high and low frequency magnetic field is used to control stress in the deposited film and adhesion to said substrate.

9. The method of claim 1 wherein etching reactant gas is added to the reactant gas to simultaneously etch the depositing film.

10. The method of claim 1 wherein etching reactant gas is added to the reactant gas to simultaneously etch the depositing film to control the film growth rate.

11. The method of claim 1 wherein etching reactant gas is added to the reactant gas to simultaneously etch the depositing film to control the film growth rate and step coverage profile.

12. The method of claim 1 wherein etching gas is added to the reactant gas to simultaneously etch the depositing film and thereby control the film growth rate; then the ratio of deposition gas flow to etching gas flow to the chamber is decreased to etch the deposited film.

13. The method of claim 1 wherein the reactant gas is of composition selected to deposit a film selected from dielectric, metal and semiconductor compositions.

14. The method of claim 1 wherein the reactant gas is of composition selected to deposit a dielectric film selected from silicon nitride, silicon oxynitride and silicon dioxide.

15. The method of claim 1 wherein the film is selected from silicon nitride, silicon oxynitride and silicon oxide and wherein the deposition parameters are adaptable for providing a deposition rate $\leqq 5,000$ Anstroms per minute.

16. The method of claim 1 wherein the reactant gas flow rate and the magnetic field intensity are selected to deposit silicon nitride at a rate $\leqq 5,000$ Angstroms per minute.

17. The method of claim 1 wherein the reactant gas is silane and nitrogen for depositing a silicon nitride film of low hydrogen content and wherein the reactant gas flow rate and the magnetic field intensity are selected to provide a silicon nitride deposition rate $\leqq 5,000$ Angstroms per minute.

18. The method of claim 1 wherein the reactant gas flow rate and the magnetic field intensity are selected to deposit silicon oxynitride at a rate $\leqq 5,000$ Angstroms per minute.

19. The method of claim 1 wherein the reactant gas flow rate and the magnetic field intensity are selected to deposit silicon dioxide at a rate $\leqq 5,000$ Angstroms per minute.

20. A silicon nitride film formed from a magnetic field-enhanced reactant gas plasma on a supporting substrate structure, characterized by hydrogen film content of less than about 13%, a wet buffered hydrogen fluoride etch rate of less than about 100 Angstroms per minute, and film stress of about $1 \times 10^{10}$ dyne/cm$^2$.

21. A silicon oxynitride film formed from a magnetic field-enhanced reactant gas plasma on a supporting substrate structure, characterized by hydrogen film content of less than about 8%, a wet buffered hydrogen fluoride etch rate of less than about 400 Angstroms per minute and film stress of about $1 \times 10^{10}$ dyne/cm$^2$.

22. A silicon dioxide film formed from a magnetic field-enhanced reactant gas plasma on a supporting substrate structure, characterized by a wet buffered hydrogen fluoride etch rate of less than about 1,100 Angstroms per minute and film stress of about $5 \times 10^9$ dyne/cm$^2$.

* * * * *